United States Patent
Cheng et al.

(10) Patent No.: US 9,246,003 B2
(45) Date of Patent: Jan. 26, 2016

(54) FINFET STRUCTURES WITH FINS RECESSED BENEATH THE GATE

(71) Applicant: GLOBALFOUNDRIES INC., Grand Cayman (KY)

(72) Inventors: Kangguo Cheng, Schnectady, NY (US); Eric C. Harley, Lagrangeville, NY (US); Yue Ke, Fishkill, NY (US); Ali Khakifirooz, Mountain View, CA (US); Alexander Reznicek, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 107 days.

(21) Appl. No.: 14/083,517

(22) Filed: Nov. 19, 2013

(65) Prior Publication Data
US 2015/0137193 A1    May 21, 2015

(51) Int. Cl.
*H01L 29/772* (2006.01)
*H01L 29/78* (2006.01)
*H01L 29/66* (2006.01)

(52) U.S. Cl.
CPC ...... *H01L 29/7842* (2013.01); *H01L 29/66795* (2013.01); *H01L 29/785* (2013.01); *H01L 29/7848* (2013.01); *H01L 29/7851* (2013.01)

(58) Field of Classification Search
CPC ............ H01L 29/66795; H01L 29/785; H01L 29/7853; H01L 29/7848
See application file for complete search history.

(56) References Cited

U.S. PATENT DOCUMENTS

| | | | |
|---|---|---|---|
| 8,450,166 B2 | 5/2013 | Zhang et al. | |
| 2011/0147828 A1* | 6/2011 | Murthy et al. | 257/327 |
| 2012/0161238 A1 | 6/2012 | Scheiper et al. | |
| 2012/0299099 A1 | 11/2012 | Huang et al. | |
| 2012/0309150 A1 | 12/2012 | Zhang et al. | |
| 2012/0309151 A1 | 12/2012 | Zhang et al. | |
| 2013/0015443 A1 | 1/2013 | He et al. | |
| 2013/0341631 A1* | 12/2013 | Maeda et al. | 257/64 |

* cited by examiner

*Primary Examiner* — Whitney T Moore
*Assistant Examiner* — Scott Stowe
(74) *Attorney, Agent, or Firm* — Scully, Scott, Murphy & Presser, P.C.

(57) ABSTRACT

A semiconductor structure may include a semiconductor fin, a gate over the semiconductor fin, a spacer on a sidewall of the gate, an angled recess region in an end of the semiconductor fin beneath the spacer, and a first semiconductor region filling the angled recess. The angled recess may be v-shaped or sigma shaped. The structure may further include a second semiconductor region in contact with the first semiconductor region and the substrate. The structure may be formed by forming a gate above a portion of the semiconductor fin on a substrate, forming a spacer on a sidewall of the gate; removing a portion of the semiconductor fin not covered by the spacer or the gate to expose a sidewall of the fin, etching the sidewall of the fin to form an angled recess region beneath the spacer, and filling the angled recess region with a first epitaxial semiconductor region.

18 Claims, 4 Drawing Sheets

FINFET STRUCTURES WITH FINS RECESSED BENEATH THE GATE

BACKGROUND

The present invention relates to semiconductor devices, and particularly to fabricating fin field effect transistors (Fin-FETs) having recessed fins.

Field effect transistors (FETs) are commonly employed in electronic circuit applications. FETs may include a source region and a drain region spaced apart by a semiconductor channel region. A gate, potentially including a gate dielectric layer, a work function metal layer, and a metal electrode, may be formed above the channel region. By applying voltage to the gate, the conductivity of the channel region may increase and allow current to flow from the source region to the drain region. To improve the conductivity of the channel, stress may be applied to the channel so that carrier mobility across the channel increases. For p-type FETs (pFETs), compressive stress may be applied. For n-type FETs (nFETs), tensile stress may be applied FinFETs are an emerging technology which may provide solutions to field effect transistor (FET) scaling problems at, and below, the 22 nm node. FinFET structures include at least one narrow semiconductor fin as the channel region of the FET and are gated on at least two sides of each of the at least one semiconductor fin. FinFETs including more than one fin may be referred to as multi-fin FinFETs. FinFET structures may be formed on a semiconductor-on-insulator (SOI) substrate, because of the low source/drain diffusion, low substrate capacitance, and ease of electrical isolation by shallow trench isolation structures. FinFETs may be also formed on bulk substrates to reduce wafer cost and/or enable formation of certain devices in the bulk substrate.

SUMMARY

An embodiment of the invention may include a method of forming a semiconductor structure by forming a gate above a portion of a semiconductor fin on a substrate; forming a spacer on a sidewall of the gate; removing a portion of the semiconductor fin not covered by the spacer or the gate to expose a sidewall of the fin; etching the sidewall of the fin to form an angled recess region beneath the spacer; and growing a first epitaxial semiconductor region that fills the angled recess region and contacts the fin. The angled recess region may be either v-shaped or sigma-shaped. The method may further include removing portions of the first epitaxial semiconductor region outside of the angled recess region and growing a second epitaxial semiconductor region that contacts the portion of the first epitaxial semiconductor region in the angled recess region.

Another embodiment of the invention may include a method of forming a semiconductor structure by forming a gate above a first portion of the semiconductor fin on a substrate, but not above a second portion of the semiconductor fin; forming a spacer on a sidewall of the gate; removing the second portion of the semiconductor fin; forming a stressor region, having an angled shape with the tallest portion of the stressor region adjacent to the end of the semiconductor fin, in an end of the first portion of the semiconductor fin; and forming a epitaxial semiconductor region adjacent to the stressor region. The stressor region may be either v-shaped or sigma-shaped. The angled recess region may be either v-shaped or sigma-shaped. The structure may further comprise a second semiconductor region contacting the first semiconductor region and the substrate.

Another embodiment of the invention may include a semiconductor structure including a semiconductor fin on a substrate; a gate over the semiconductor fin, a spacer on a sidewall of the gate; and angled recess region in an end of the semiconductor fin beneath the spacer; and a first semiconductor region filling the angled recess region.

Figure 1:
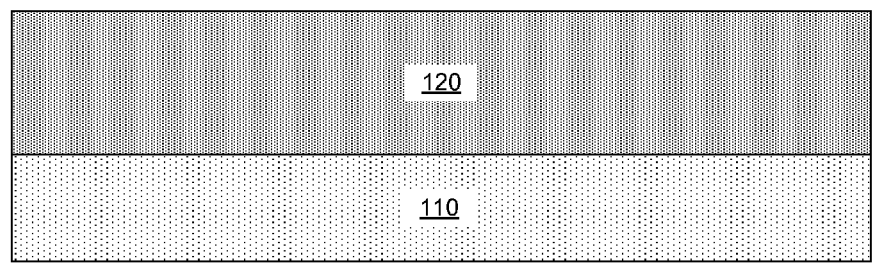
FIG. 1 is a side view depicting a semiconductor fin above a substrate, according to an embodiment of the present invention.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Embodiments of the present invention may include methods of forming FinFET structures having angled recessed fins, as well as the resulting structure. The FinFET structure may be formed by forming a fin above a substrate, forming a gate above the fin, forming spacers on sidewalls of the gate, removing portions of the fin outside the gate and the spacers, and then etching the remaining portion of the fin beneath the gate and the spacers to form a angled recess. In some embodiments, the angled recess may then be filled with a stressor material that will apply stress to the fin. Because the stressor material contacts the fin on more than one plane due to the angled recess, stress may be applied to the fin more effectively relative to structures where the stressor contacts the fin on only a single plane.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Referring to FIG. 1, a fin 120 may be formed above a substrate 110. The fin 120 may have a width ranging from approximately 2 nm to approximately 40 nm, preferably approximately 4 nm to approximately 20 nm; a height ranging from approximately 5 nm to approximately 300 nm, preferably approximately 10 nm to approximately 80 nm. The fins 120 may be formed, for example by removing material from the substrate 110 using a photolithography process followed by an anisotropic etching process such as reactive ion etching (RIE) or plasma etching. Other methods of forming fins known in the art may also be utilized, such as sidewall image transfer (SIT).

In some embodiments, the substrate 110 may be either a bulk substrate or a semiconductor on insulator (SOI) substrate. In embodiments where the substrate 110 is a bulk substrate, the material of the fin 120 may be the same as the substrate 110 and there may be no identifiable boundary between the fin 120 and the substrate 110. The substrate 110 may be made of any semiconductor material typically known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide.

In embodiments where the substrate 110 is an SOI substrate, the fins 120 may be formed from a top semiconductor layer separated from a base semiconductor substrate by a buried insulator layer (not shown). In such embodiments, the top semiconductor layer and the base semiconductor substrate may be made of the same materials as the bulk substrate discussed above. The buried insulator layer may have a thickness ranging from approximately 100 to approximately 500 nm, preferably about 200 nm. In such embodiments, the fin 120 may rest on the buried insulator layer, separated from the base semiconductor substrate.

Figure 2:
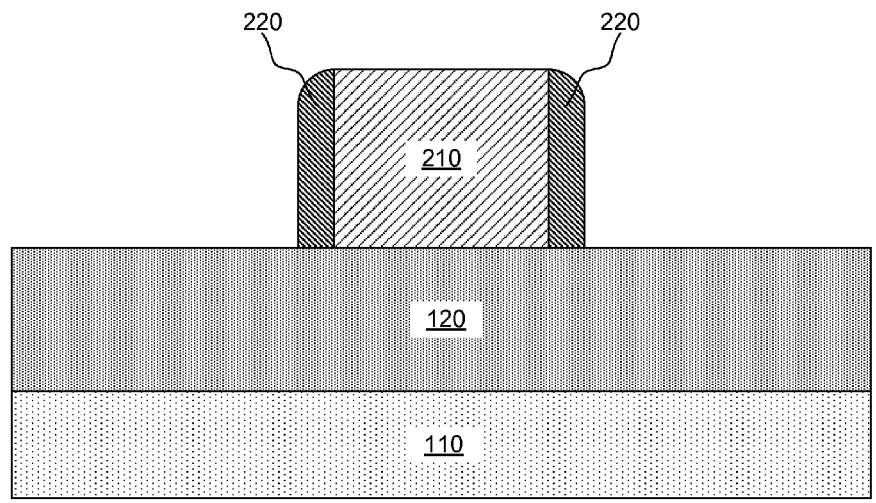
FIG. 2 is a side view depicting forming a gate having spacers on its sidewalls above the semiconductor fin of FIG. 1, according to an embodiment of the present invention.

Referring to FIG. 2, a gate 210 may be formed over a portion of the fin 120, typically a center portion as depicted. The gate structure may have a height of approximately 40 nm to approximately 200 nm, preferably approximately 50 nm to approximately 150 nm. The gate 210 may include a gate dielectric layer on the fin 120 (not shown) and a gate electrode on the gate dielectric layer (not shown) that may be formed via any known process in the art, including a gate-first process and a gate-last process.

In a gate-first process, the gate dielectric layer may include any suitable insulating material including, but not limited to: oxides, nitrides, oxynitrides or silicates including metal silicates and nitrided metal silicates. In one embodiment, the gate dielectric may include a high-k oxide such as, for example, silicon oxide ($Si_xO_y$), hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The gate dielectric layer may be deposited over the fin 120 using any suitable deposition technique known the art, including, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD). The gate electrode 530 may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The gate electrode may be formed using any suitable metal deposition technique, including, for example, CVD, PVD, and ALD, sputtering, and plating.

In a gate-last process, the gate 210 may include a sacrificial gate (not shown) that may be later removed and replaced by a gate dielectric layer and a gate electrode such as those of the gate-first process described above. In an exemplary embodiment, the sacrificial gate may be made of a polysilicon material with a sacrificial dielectric material (e.g., silicon oxide) formed using known deposition techniques known in the art, including, for example, ALD, CVD, PVD, MBD, PLD, LSMCD, sputtering, and plating. Other suitable materials and methods of forming a sacrificial gate are known in the art.

The gate 210 may also include a hard cap (not shown) made of an insulating material, such as, for example, silicon nitride, capable of protecting the gate electrode and gate dielectric during subsequent processing steps. In embodiments where the substrate 110 is a bulk substrate, an insulating layer may be deposited around the base of the fin prior to forming the gate 210 to insulate the gate 210 from the substrate 110. Further, while only a single gate 210 is shown, some embodiments may include more than one gate above the fin 120.

Still referring to FIG. 2, spacers 220 may be formed on the sidewalls of the gate 210. The spacers 220 may be made of any suitable insulating material, such as silicon nitride, silicon oxide, silicon oxynitrides, or a combination thereof, and may have a thickness ranging from 2 nm to approximately 100 nm, In a preferred embodiment, the spacers 220 may be made of silicon nitride and have a thickness ranging from approximately 2 nm to approximately 25 nm. The spacers 220 may be formed by any method known in the art, including depositing a conformal silicon nitride layer over the sacrificial gate 120 and removing unwanted material from the conformal silicon nitride layer using an anisotropic etching process such as, for example, reactive ion etching (RIE) or plasma etching (not shown). Methods of forming spacers are well-known in the art and other methods are explicitly contemplated. Further, in various embodiments, the spacers 220 may include one or more layers. While the spacers 220 are herein described in the plural, the spacers 220 may consist of a single spacer surrounding the sacrificial gate 120.

Figure 3:
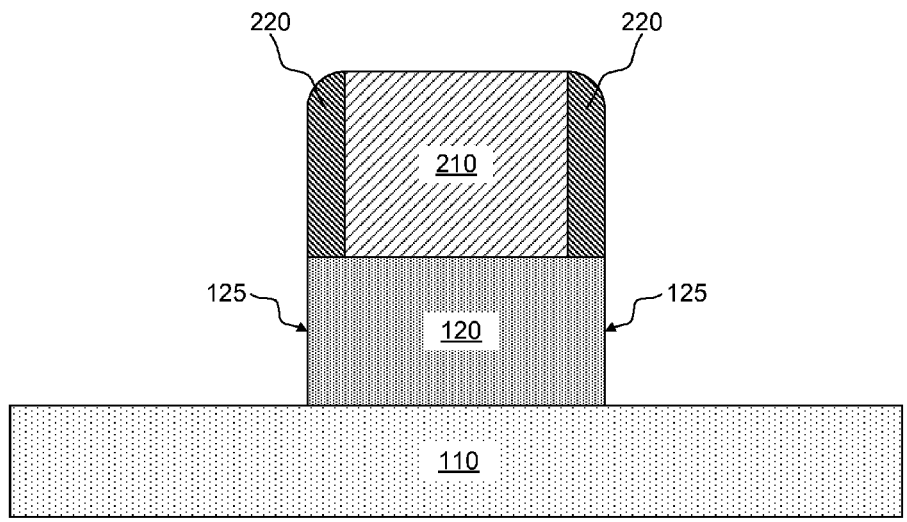
FIG. 3 is a side view depicting removing portions of the fin not covered by the gate or the spacers, according to an embodiment of the present invention.

Referring to FIG. 3, portions of the fin 120 not covered by the gate 210 or the spacers 220 may be removed to expose sidewalls 125 of the fin 120. The portions of the fin 120 may be removed using any suitable anisotropic etching process capable of removing material from the fin 120 without substantially impacting the surrounding structures, including, but not limited to, the gate 210, the spacers 220, and the substrate 110. Exemplary etching processes may include, for example, reactive ion etching (RIE) and plasma etching.

Figure 4:
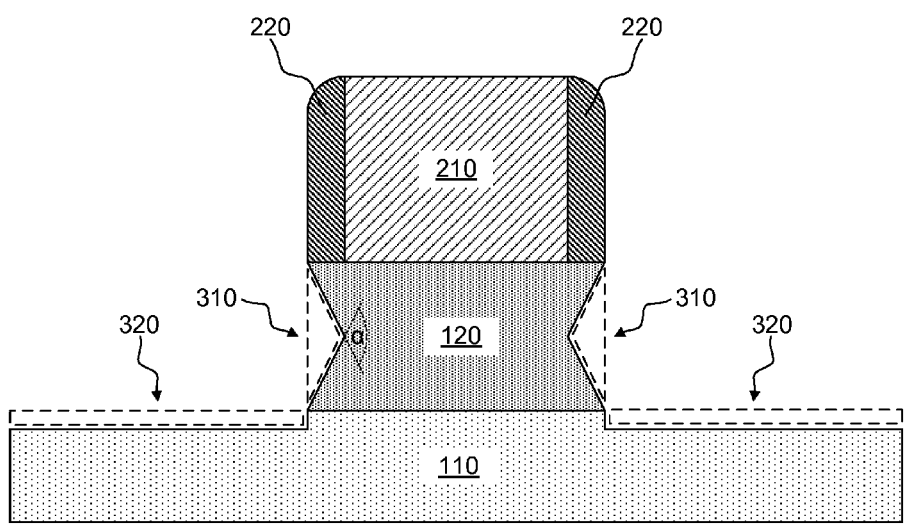
FIG. 4 is a side view depicting etching angled recess regions into the portion of the fin beneath the fin and the spacers, according to an embodiment of the present invention.
Figure 5:
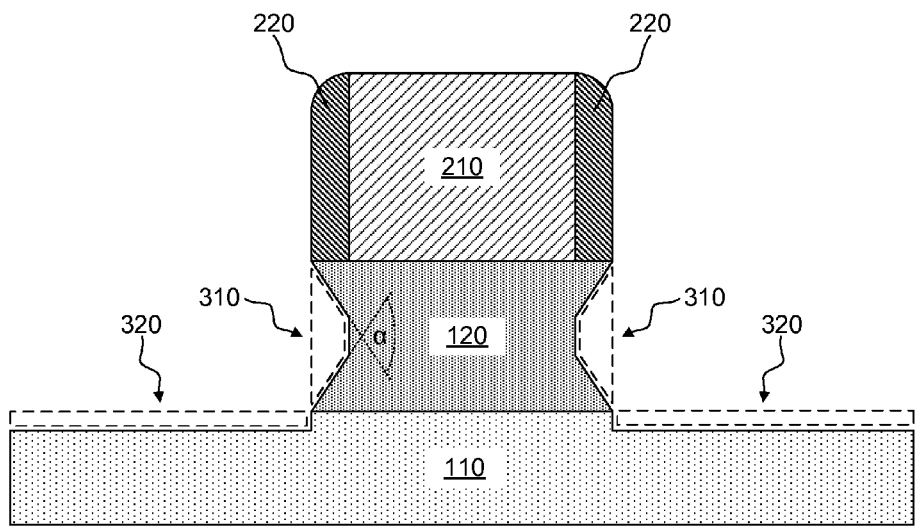
FIG. 5 is a side view depicting etching sigma-shaped recess regions into the portion of the fin beneath the fin and the spacers, according to an embodiment of the present invention.

Referring to FIG. 4, the sidewalls 125 of the fin 120 may be etched to form angled recess regions 310 beneath the spacers 220. In some embodiments, the angled recess regions 310 may extend beneath the gate 210. The angled recess regions 310 may be v-shaped, as depicted in FIG. 4. In other embodiments, the angled recess regions 310 may have a sigma-shaped recess, with an approximately vertical sidewall connecting the two angled faces of the recess, as depicted in FIG. 5.

In an exemplary embodiment, the angled recess regions 310 may be formed by a timed wet or gaseous etch process using, for example, tetramethylammonium hydroxide (TMAH). In other embodiments, gaseous hydrogen chloride (HCl) may be used in lieu of, or in addition to TMAH. The duration of the etch process may determine the depth and shape of the angled recess regions 310. In an exemplary embodiment, approximately 300 sccm HCl gas in approximately 35 slm of a carrier gas, such as hydrogen, may be flowed into a process chamber at approximately 650° C. for a time ranging from approximately 10 seconds to approximately 30 seconds. The etch time may be less than 10 seconds or greater than 30 seconds depending on the other etch process parameters, including etchant (e.g., HCl or TMAH) flow rate, carrier gas flow rate, and temperature.

Prior to etching the sidewall 125 may have a <110> crystal lattice structure, which will etch faster than planes having a <111> crystal lattice structure. As the etch progresses, the <110> plane of the sidewall 125 may be etched away to expose <111> planes angled inward away from the sidewall 125. These <111> planes may form the boundary of the angled recess regions 310. If the etch proceeds to the point where the <111> planes intersect, then the angled recess regions 310 may be v-shaped. Otherwise, the angled recess regions 310 may be sigma-shaped. In an exemplary embodiment, the angled recess regions 310 may have a depth, measured from the outer edge of the spacer 220 to the deepest point of the angled recess region 310, ranging from approximately 4 nm to approximately 20 nm, preferably ranging from approximately 6 nm to approximately 14 nm. The depth of the angled recess region 310 may be such that the angle α of recess may be at least approximately 109.4°.

While etching the sidewalls 125 of the fin 120 to form the angled recess regions 310, portions 320 of the substrate 110 may also be etched where the top surface of the substrate 110 is a similar semiconductor material as the material of the fin 120. In embodiments where the top surface of the substrate is not a semiconductor material similar to the fin 120, such as in an SOI substrate, the substrate 110 may not be etched. The portions 320 may have a depth ranging from approximately 2 nm to approximately 20 nm. Because the depth of the portions 320 is small relative to the thickness of the substrate 110, any etching of the substrate 110 while forming the angled recess regions 310 may not substantially impact the performance or operability of the final structure.

Figure 6:
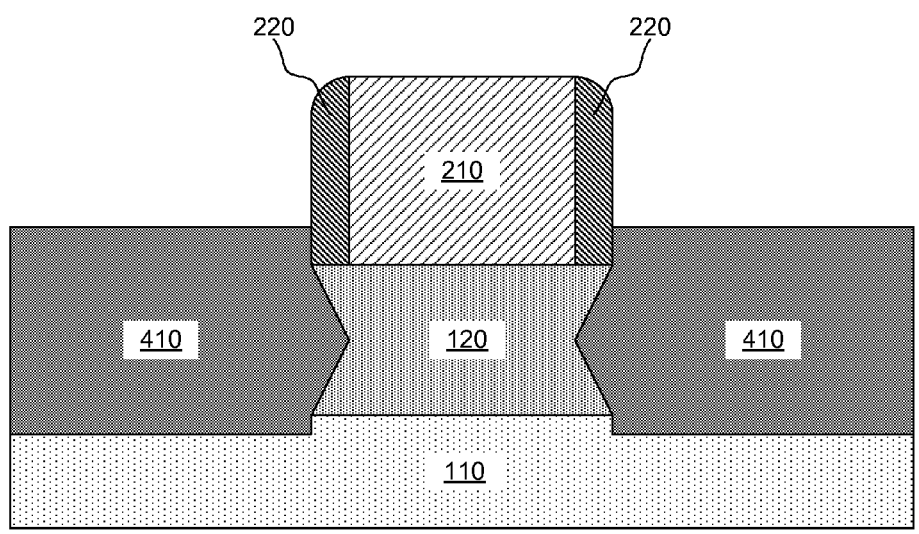
FIG. 6 is a side view depicting growing first semiconductor regions on the substrate that fill the angled recess regions, according to an embodiment of the present invention.

Referring to FIG. 6, first semiconductor regions 410 may be formed by growing epitaxial semiconductor regions on the substrate 110, so that the first semiconductor regions 410 fill the angled recess regions 310. Because the epitaxy process may be performed in the same process chamber as the gaseous etch used to etch the sidewalls 125 (FIG. 3) of the fin 120, the first semiconductor regions 410 may be formed in situ following the etching the sidewalls 125. In embodiments where the top surface of the substrate 110 is a material not capable of supporting the growth of the first semiconductor regions 410, such as the buried insulator layer of an SOI substrate, the substrate 110 may first be etched to expose a semiconductor layer. The first semiconductor regions may be made of any semiconductor material typically known in the art, including, for example, silicon, germanium, silicon-germanium alloy, carbon-doped silicon, carbon-doped silicon germanium, and compound (e.g. III-V and II-VI) semiconductor materials. The first semiconductor regions 410 may be doped or undoped.

In an exemplary embodiment, the first semiconductor regions 410 may include a stressor material, for example silicon-germanium for pFETs or carbon-doped silicon for nFETs, so that the first semiconductor regions 410 may apply either a tensile or compressive strain to the fin 120. Because the first semiconductor regions 410 fills the angled recess regions 310 and therefore has more than one plane of contact with the fin 120, the first semiconductor regions 410 may apply a greater amount of stress relative to an equivalent stressor having only a single plane of contact with the fin 120. The depth of the angled recess regions 310 may be calibrated so that the first semiconductor regions 410 apply a desired amount of stress to the fin 120. Increasing the size of the first semiconductor regions 410 will increase the amount of strain on the fin 120, at the expense of decreasing the length of the fin 120.

In some embodiments, the first semiconductor regions 410 may act as the source/drain regions of the FinFET device. In such embodiments, the formation of the first semiconductor regions 410 may be followed by a typical process flow, including depositing an interlevel dielectric (ILD) layer over the structure, replacing the sacrificial gate, if present, with a replacement metal gate, and forming metal contacts electrically contacted to the first semiconductor regions 410 and the gate 210. For pFETs, the first semiconductor regions 410 may be made of silicon-germanium with a germanium concentration ranging from approximately 20% to approximately 75%, preferably ranging from approximately 30% to approximately 60%, and may be doped with p-type dopants such as boron in concentrations ranging from approximately $1 \times 10^{20}$ atoms/cm$^3$ to approximately $2 \times 10^{21}$ atoms/cm$^3$, preferably $4 \times 10^{20}$ atoms/cm$^3$ to approximately $9 \times 10^{20}$ atoms/cm$^3$. For nFETs, the first semiconductor regions 410 may be made of carbon-doped silicon with a carbon concentration ranging from approximately 0.5% to approximately 2.5%, and may be doped with n-type dopants such as arsenic or phosphorus in concentrations ranging from approximately $1 \times 10^{20}$ atoms/cm$^3$ to approximately $2 \times 10^{21}$ atoms/cm$^3$, preferably $4 \times 10^{20}$ atoms/cm$^3$ to approximately $9 \times 10^{20}$ atoms/cm$^3$. Higher and lower concentrations of carbon, germanium, and dopants are explicitly contemplated.

In other embodiments, however, it may be desired to have source/drain regions having differing stressor or dopant concentrations than the first-semiconductor regions 410, as described below in conjunction with FIGS. 7-8. In an exemplary embodiment, it may be desired for the first semiconductor regions 410 to have lower dopant concentrations than the source/drain regions. For pFETs, the first semiconductor regions 410 may be made of silicon-germanium with a germanium concentration ranging from approximately 20% to approximately 75%, preferably ranging from approximately 30% to approximately 60%, and may be doped with p-type dopants such as boron in concentrations ranging from approximately $1\times10^{19}$ atoms/cm$^3$ to approximately $2\times10^{21}$ atoms/cm$^3$, preferably $4\times10^{20}$ atoms/cm$^3$ to approximately $9\times10^{20}$ atoms/cm$^3$. For nFETs, the first semiconductor regions 410 may be made of carbon-doped silicon with a carbon concentration ranging from approximately 0.5% to approximately 2.5%, and may be doped with n-type dopants such as arsenic or phosphorus in concentrations ranging from approximately $1\times10^{20}$ atoms/cm$^3$ to approximately $2\times10^{21}$ atoms/cm$^3$, preferably $4\times10^{20}$ atoms/cm$^3$ to approximately $9\times10^{20}$ atoms/cm$^3$. Higher and lower concentrations of carbon, germanium, and dopants are explicitly contemplated.

Figure 7:
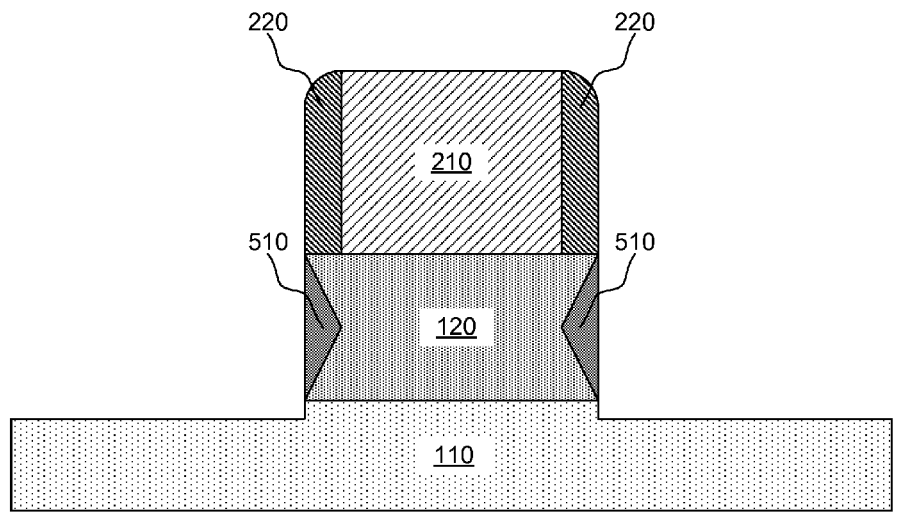
FIG. 7 is a side view depicting removing portions of the first semiconductor regions outside the angled recess regions, according to an embodiment of the present invention.

Referring to FIG. 7, the portions of the first semiconductor regions 410 not covered by the gate 210 or the spacers 220 may be removed, leaving first semiconductor portions 510 in contact with the fin 120. The portions of the first semiconductor regions 410 may be removed using any suitable anisotropic etching process capable of removing material from the first semiconductor regions 410 without substantially impacting the surrounding structures, including, but not limited to, the substrate 110, the gate 210, the spacers 220, and the first semiconductor portions 510.

Figure 8:
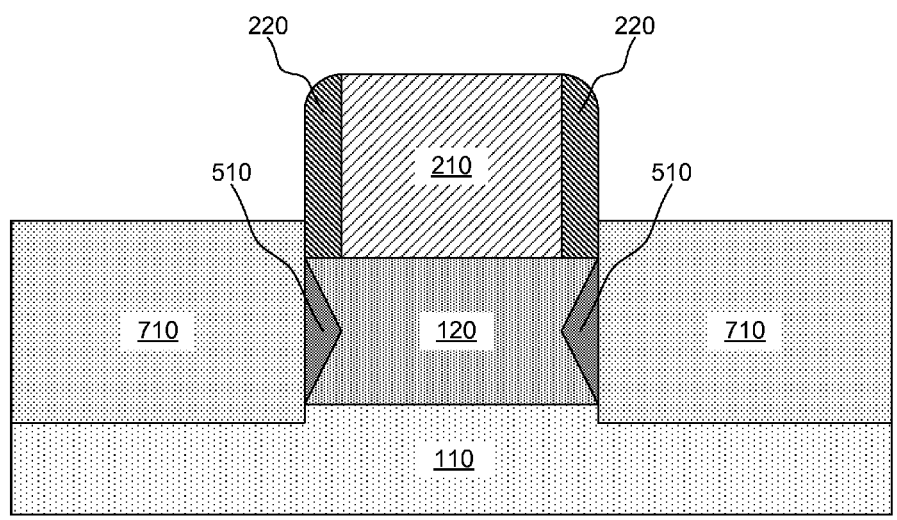
FIG. 8 is a side view depicting growing second semiconductor regions on the substrate in contact with the first semiconductor regions, according to an embodiment of the present invention.

Referring to FIG. 8, second semiconductor regions 710 may be formed in contact with the first semiconductor portions 510 by growing epitaxial semiconductor regions on the substrate 110. The second semiconductor regions 710 may be made of any semiconductor material typically known in the art, including, for example, silicon, germanium, silicon-germanium alloy, carbon-doped silicon, carbon-doped silicon-germanium alloy, and compound (e.g. III-V and II-VI) semiconductor materials. The second semiconductor regions 710 may be doped or undoped. In an exemplary embodiment, the first semiconductor material includes doped silicon-germanium or doped carbon-doped silicon and the second semiconductor regions 710 includes the same semiconductor material as the first semiconductor material, but not including any dopants. For pFETs, the second semiconductor regions 710 may be made of silicon-germanium with a germanium concentration ranging from approximately 20% to approximately 75%, preferably ranging from approximately 30% to approximately 60%, and may be doped with p-type dopants such as boron in concentrations ranging from approximately $1\times10^{20}$ atoms/cm$^3$ to approximately $2\times10^{21}$ atoms/cm$^3$, preferably $4\times10^{20}$ atoms/cm$^3$ to approximately $9\times10^{20}$ atoms/cm$^3$. For nFETs, second semiconductor regions 710 may be made of carbon-doped silicon with a carbon concentration ranging from approximately 0.5% to approximately 2.5%, and may be doped with n-type dopants such as arsenic or phosphorus in concentrations ranging from approximately $1\times10^{20}$ atoms/cm$^3$ to approximately $2\times10^{21}$ atoms/cm$^3$, preferably $4\times10^{20}$ atoms/cm$^3$ to approximately $9\times10^{20}$ atoms/cm$^3$. Higher and lower concentrations of carbon, germanium, and dopants are explicitly contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

The invention claimed is:

1. A method of forming a semiconductor structure, the method comprising:
    forming a gate above a portion of a semiconductor fin on a substrate;
    forming a spacer on a sidewall of the gate;
    removing a portion of the semiconductor fin not covered by the spacer or the gate to expose a sidewall of the fin;
    etching the sidewall of the fin to form an angled recess region beneath the spacer;
    growing a first epitaxial semiconductor region on the substrate, the first epitaxial semiconductor region filling the angled recess region and contacting the fin;
    removing portions of the first epitaxial semiconductor region outside of the angled recess region; and
    growing a second epitaxial semiconductor region on the substrate, the second epitaxial semiconductor region contacting a portion of the first epitaxial semiconductor region in the angled recess region.

2. The method of claim 1, wherein the first epitaxial semiconductor region has the same material composition but a lower dopant concentration than the second epitaxial semiconductor region.

3. The method of claim 1, wherein the angled recess region is v-shaped.

4. The method of claim 1, wherein the angled recess region is sigma-shaped.

5. The method of claim 1, wherein the first semiconductor region comprises a stressor material.

6. The method of claim 5, wherein the first semiconductor region comprises silicon germanium or carbon-doped silicon.

7. A method of forming a semiconductor structure, the method comprising:
    forming a gate above a first portion of the semiconductor fin on a substrate, wherein a second portion of the semiconductor fin is not covered by the gate;
    forming a spacer on a sidewall of the gate;
    removing the second portion of the semiconductor fin;
    forming a stressor region in an end of the first portion of the semiconductor fin, wherein the stressor region comprises a first epitaxial semiconductor material having an angled shape with the tallest portion of the stressor region adjacent to the end of the semiconductor fin, wherein an outer sidewall surface of the stressor region does not extend beyond an outer sidewall surface of the spacer;
    forming an epitaxial semiconductor region comprising a second epitaxial semiconductor material adjacent to the stressor region, said epitaxial semiconductor region has a sidewall surface directly contacting the outer sidewall surface of the stressor region and a bottommost surface contacting a surface of the substrate.

8. The method of claim 7, wherein the stressor region is v-shaped.

9. The method of claim 7, wherein the stressor region is sigma-shaped.

10. The method of claim 7, wherein the first epitaxial semiconductor material of the stressor region has the same material composition but a lower dopant concentration than the second epitaxial semiconductor material of the epitaxial semiconductor region.

11. The method of claim 7, wherein the stressor region comprises silicon-germanium or carbon-doped silicon.

12. A semiconductor structure comprising:
a semiconductor fin on a substrate;
a gate over the semiconductor fin;
a spacer on a sidewall of the gate;
an angled recess region in an end of the semiconductor fin beneath the spacer;
a first semiconductor region filling the angled recess region, the first semiconductor region is located beneath the spacer and has an outer sidewall surface that is vertically aligned to an outer sidewall surface of the spacer; and
a second semiconductor region having a sidewall surface directly contacting the outer sidewall surface of the first semiconductor region and vertically aligned to the outer sidewall surface of the spacer and a bottommost surface contacting a surface of the substrate.

13. The structure of claim 12, wherein the angled recess region is v-shaped.

14. The structure of claim 12, wherein the angled recess region is sigma-shaped.

15. The structure of claim 12, wherein the first semiconductor region applies stress to the semiconductor fin.

16. The structure of claim 12, wherein the first semiconductor region comprises a stressor material.

17. The semiconductor structure of claim 12, wherein the first semiconductor region contacts the substrate.

18. The semiconductor structure of claim 12, wherein the first semiconductor region has the same material composition but a lower dopant concentration than the second semiconductor region.

* * * * *